(12) United States Patent
McCullagh et al.

(10) Patent No.: US 10,727,887 B1
(45) Date of Patent: Jul. 28, 2020

(54) SUPER-HETERODYNE RADIO RECEIVER WITH IMPROVED IMAGE REJECTION

(71) Applicant: u-blox AG, Thalwil (CH)

(72) Inventors: Mici McCullagh, Lisburn (GB); Thomas William Mewhort Frazer, Gullane (GB)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 16/724,974

(22) Filed: Dec. 23, 2019

(51) Int. Cl.
*H04B 1/26* (2006.01)
*H04B 1/10* (2006.01)
*H04B 1/00* (2006.01)

(52) U.S. Cl.
CPC ............ *H04B 1/26* (2013.01); *H04B 1/0053* (2013.01); *H04B 1/10* (2013.01)

(58) Field of Classification Search
CPC ... H04B 1/04; H04B 1/10; H04B 1/16; H04B 1/18; H04B 1/26; H04B 1/30; H04B 1/40; H04B 1/0053; H04B 15/00; H04B 17/20
See application file for complete search history.

(56) References Cited

U.S. PATENT DOCUMENTS

| | | | | |
|---|---|---|---|---|
| 6,127,962 A | * | 10/2000 | Martinson | H03D 7/18 331/42 |
| 6,985,710 B1 | * | 1/2006 | Margairaz | H03D 7/18 455/266 |
| 2005/0064838 A1 | | 3/2005 | Oh et al. | |
| 2006/0205377 A1 | * | 9/2006 | Margairaz | H04B 1/28 455/285 |
| 2008/0175307 A1 | * | 7/2008 | Brunn | H04B 1/109 375/148 |
| 2015/0236390 A1 | * | 8/2015 | Analui | H04B 1/123 375/219 |

* cited by examiner

*Primary Examiner* — Thanh C Le
(74) *Attorney, Agent, or Firm* — Finnegan, Henderson, Farabow, Garrett & Dunner, L.L.P.

(57) ABSTRACT

A receiver apparatus coupled to receive an RF signal having frequency components in a desired band and an image band, includes: an image rejection filter; a local oscillator to produce a first signal; a frequency divider to produce a plurality of second signals; a first mixer, coupled to receive the RF signal and the first signal, to produce an intermediate signal; and a frequency translation filter including a plurality of mixers each coupled to receive the intermediate signal and a different one of the plurality of second signals; and at least one impedance coupled as a load to each of the plurality of mixers, wherein: the image rejection filter and the frequency translation filter are configured to operate in conjunction to form a band-pass filter in the desired band and a band-stop filter in the image band and to apply the band-pass filter and band-stop filter to the RF signal.

20 Claims, 7 Drawing Sheets

SUPER-HETERODYNE RADIO RECEIVER WITH IMPROVED IMAGE REJECTION

TECHNICAL FIELD

Apparatuses and methods consistent with the present disclosure relate generally to a radio receiver and, more particularly, to a super-heterodyne radio receiver.

BACKGROUND

In wireless communication, radio frequency (RF) receivers are used in a wide variety of applications such as television, cellular telephones, pagers, global navigation satellite system (GNSS) receivers, cable modems, cordless phones, satellite radio receivers, and the like. As used herein, a "radio frequency" signal or RF signal is an electrical signal conveying useful information and having at least one oscillation frequency, regardless of the medium through which the signal is conveyed. Typically the useful information of an RF signal is carried on top of an RF carrier frequency and needs to be converted to base band so that the information contained therein can be more conveniently extracted. Radio receivers are devices utilized to achieve this goal. One type of radio receiver is a super-heterodyne receiver, in which an incoming RF signal, received by an antenna, is mixed with a signal from a local oscillator (LO) to produce a mixed lower frequency signal called an intermediate frequency (IF) signal. The IF signal is then further down-converted in one or more additional steps, before being amplified, filtered, and converted to a base band signal. The base band signal can be demodulated and provided to a detector that extracts information conveyed by the received RF signal.

In a conventional super-heterodyne receiver having one or more stages of down-conversion, a local oscillator (LO) is used to mix the incoming radio frequency (RF) signal, generating sum and difference frequencies. A "real" mixer is often used in one or more stages of the down-conversion. One problem with mixing using a real mixer is the presence of image signals. When the real mixer is used to shift an RF signal either up or down the frequency spectrum as part of a mixing process, other spectral components that lie within the bandwidth of the mixer may be shifted as well. A special case of such problematic spectral components is termed image frequencies. Image frequencies form an image band that extends from the LO frequency on opposite sides of a desired band. Both the image and desired frequency bands may be down-converted to the same lower frequency as a result of the mixing process in the real mixer, unless some means is provided to prevent it.

In some RF systems, the level of the image signals is small enough that designers can rely on attenuation characteristics of an RF band-pass filter alone to reject the image band. In other systems, the attenuation provided solely by the RF band-pass filter is not sufficient. One known image rejection method uses a notch filter to reject the image band before the RF signal enters the mixer. The center frequency of the notch filter is set to track the local oscillator frequency so that signals having frequencies in the image band are attenuated.

A designer may choose the IF signal to have a relatively high intermediate frequency, thus providing more separation in the bandwidth between the image band and the desired band, and making it easier for a notch filter to reject image band signals. However, choosing a higher intermediate frequency comes at a cost, such as an increase in power consumption in succeeding stages of receiver circuits. Furthermore, designing circuits to operate at a higher frequency is more demanding and consequently not desirable. Alternatively, a designer may select a relatively low intermediate frequency, which in turn necessitates a higher performance notch filter. However, fabricating and integrating high-performance filters in RF integrated circuits can be difficult and costly. For example, high-performance notch filters, such as SAW filters, cannot be integrated on-chip. Therefore, the designer may be forced to accept compromises in either image rejection performance or other design parameters, or both.

Realistically, even in a super-heterodyne receiver circuit with a relatively high IF frequency, there are circuit components that have a finite frequency response in the image frequency band, and some of the image signals will still be down-converted along with the desired signal.

SUMMARY

In accordance with the present disclosure, there is provided a receiver apparatus coupled to receive a radio frequency (RF) signal, the RF signal including frequency components in a desired band and an image band, comprising: an image rejection filter; a local oscillator configured to produce a first signal at a first frequency; a frequency divider configured to produce a plurality of second signals each at a second frequency; a first mixer, coupled to receive the RF signal at a first input and the first signal at a second input, and configured to produce an intermediate signal at an intermediate frequency, the intermediate frequency being dependent on the first frequency; and a frequency translation filter comprising a plurality of passive mixers each coupled to receive the intermediate signal at a first input and a different one of the plurality of second signals at a second input; and at least one impedance coupled as a load to an output of each of the plurality of passive mixers, wherein: the image rejection filter and the frequency translation filter are configured to operate in conjunction to form a band-pass filter in the desired band and a band-stop filter in the image band and to apply the band-pass filter and band-stop filter to the RF signal.

Also in accordance with the present disclosure, there is provided a method of down-converting a radio frequency (RF) signal in a receiver apparatus, the method comprising: filtering the RF signal by an image rejection filter to reject frequency components in an image band; producing a first signal at a first frequency by a local oscillator; coupling the filtered RF signal and the first signal to a first mixer to produce an intermediate signal at an intermediate frequency; producing a plurality of second signals by a frequency divider, each at a second frequency; and coupling the intermediate signal and the plurality of second signals to a frequency translation filter having a cut-off frequency, the frequency translation filter comprising a plurality of passive mixers each coupled to receive the intermediate signal at a first input and a different one of the plurality of second signals at a second input; and at least one impedance coupled as a load to an output of each of the plurality of passive mixers, wherein: the image rejection filter and the frequency translation filter are configured to operate in conjunction to form a band-pass filter in a desired band and a band-stop filter in the image band and to apply the band-pass filter and band-stop filter to the RF signal.

DETAILED DESCRIPTION

References will now be made in detail to exemplary embodiments, examples of which are illustrated in the accompanying drawings. The following description refers to the accompanying drawings in which the same numbers in different drawings represent the same or similar elements unless otherwise specified. The implementations set forth in the following disclosure are consistent with aspects related to the invention as recited in the appended claims.

Figure 1:
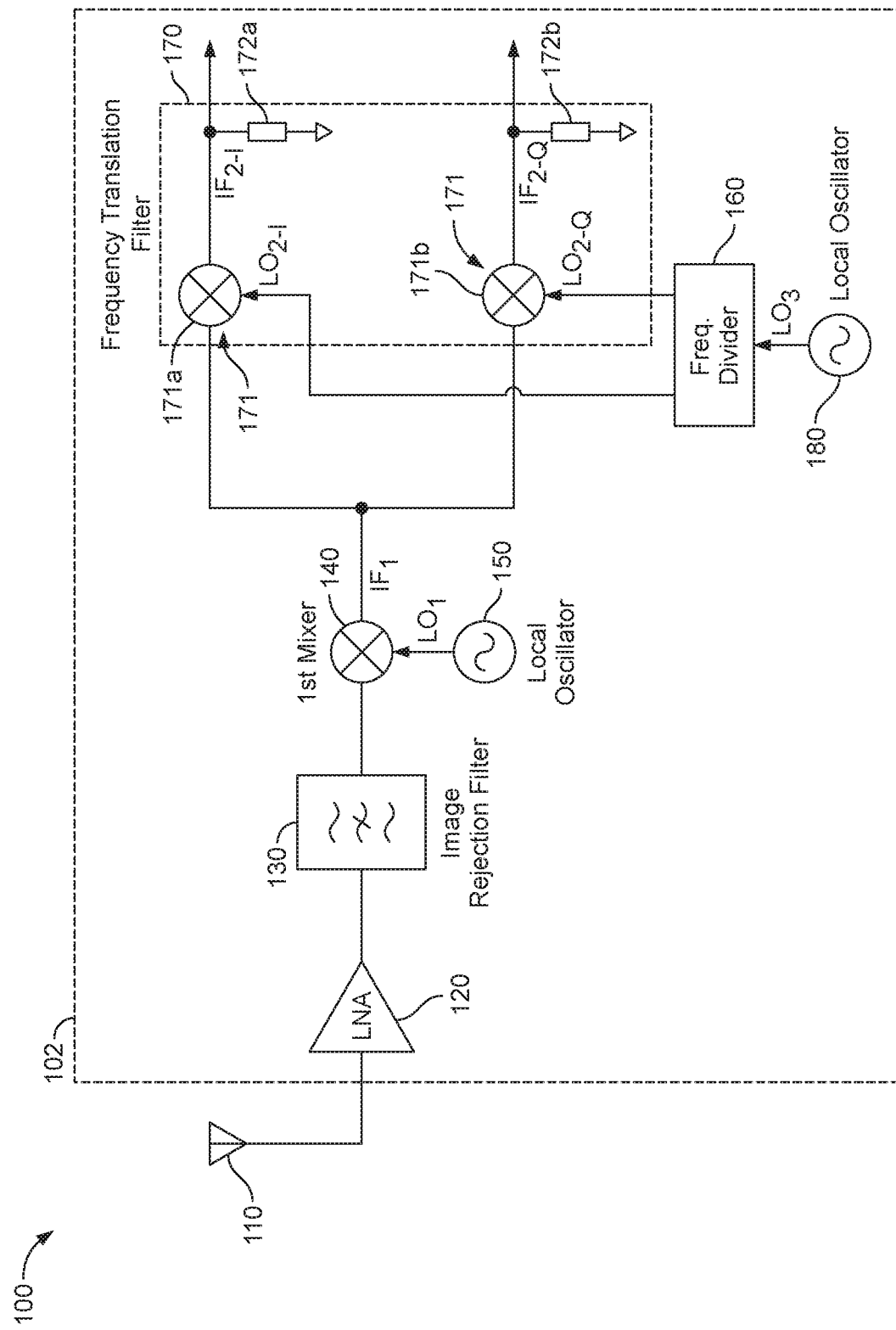
FIG. 1 is a schematic diagram illustrating an exemplary embodiment of a receiver apparatus implemented as part of a super-heterodyne radio receiver according to some embodiments of the present disclosure.

FIG. 1 illustrates an embodiment of a receiver apparatus 102, implemented within a super-heterodyne radio receiver 100, coupled to an antenna 110. The receiver apparatus 102 comprises a low-noise amplifier (LNA) 120, an image rejection filter 130, a first mixer 140, a first local oscillator 150, a frequency divider 160, a frequency translation filter 170, and a second local oscillator 180.

The antenna 110 may include one or more conductors, electrically coupled to the receiver apparatus 102. The antenna 110 is configured to receive an oscillating electromagnetic field of an incoming radio wave which carries a radio frequency (RF) signal at an RF frequency ($f_{RF}$).

The low-noise amplifier (LNA) 120, if it is present, is coupled to receive the RF signal from the antenna 110 and amplifies the RF signal. The LNA 120 functions to increase the sensitivity of the receiver 100 by amplifying the RF signal while at the same time minimizing the addition of extra noise.

The image rejection filter 130 is coupled to receive the amplified RF signal. In the present embodiment, the image rejection filter 130 is a discrete circuit element (i.e., off-chip) external to the other component of the receiver apparatus 102. However, without limitation, the image rejection filter 130 may alternatively be implemented on-chip. For example, the image rejection filter 130 may be provided as an integrated element of the first mixer 140. Alternatively, the image rejection filter 130 may be provided as an integrated element of the low-noise amplifier (LNA) 120. The image rejection filter 130 may be implemented as a notch filter. For example, the notch filter may be an RF tunable notch filter that rejects frequencies of the amplified RF signal in the image band by presenting a frequency selective short circuit in the image band, allowing signals in a pass-band, i.e., a non-rejected frequency band, to be mixed at the first mixer 140. Accordingly, the image rejection filter produces a filtered RF signal.

The first mixer 140 is a real mixer coupled to receive the filtered RF signal in the present embodiment. A real mixer, in contrast to a complex mixer, does not distinguish between signals located at an equal frequency above and below a local oscillator (LO) frequency, referred to herein as a mixing frequency. The first mixer 140 frequency translates the filtered RF signal to another frequency. More particularly, the first mixer 140 mixes the filtered RF signal with a first signal ($LO_1$) produced by the first local oscillator 150, at a first frequency ($f_{LO1}$). The first mixer 140 produces an intermediate frequency signal having an intermediate frequency ($f_{IF1}$), hereafter termed intermediate signal ($IF_1$).

The frequency divider 160 is coupled to receive as input, a third signal ($LO_3$) at a third frequency ($f_{LO3}$) produced by the second local oscillator 180 and configured to produce a plurality of second signals ($LO_2$) each at a second frequency ($f_{LO2}$). In the present embodiment, the plurality of second signals ($LO_2$) consist of an in-phase LO signal ($LO_{2-I}$) and a quadrature phase LO signal ($LO_{2-Q}$), each occurring at the same second frequency ($f_{LO2}$). "In-phase" and "quadrature phase" refer to two sinusoidal signals that have the same frequency and amplitude but are 90 degrees out of phase.

The frequency translation filter 170, which may also be referred to herein as a "translational filter", includes a quadrature mixer 171. In the present embodiment, the quadrature mixer 171 includes passive mixers 171a and 171b, each respectively coupled to a first terminal of impedances 172a and 172b. The second terminal of impedances 172a and 172b are coupled to a reference potential or voltage, such as ground. The passive mixers 171a and 171b are each coupled to receive as inputs the intermediate signal ($IF_1$) produced by the first mixer 140 and a different one of the plurality of second signals ($LO_2$). In the present embodiment, the second signals ($LO_2$) consist of an in-phase LO signal ($LO_{2-I}$) and a quadrature-phase LO signal ($LO_{2-Q}$). The passive mixer 171a is coupled to receive the in-phase second signal ($LO_{2-I}$) and the passive mixer 171b is coupled to receive the quadrature-phase second signal ($LO_{2-Q}$). Thus the quadrature mixer 171 mixes the intermediate signal ($IF_1$) with the in-phase and quadrature phase LO signals to produce in-phase and quadrature-phase second intermediate frequency signals $IF_{2-I}$ and $IF_{2-Q}$, respectively, at a lower frequency.

While FIG. 1 illustrates that the antenna 110 is distinct from the receiver apparatus 102, it should now be appreciated that the antenna 110 may also be implemented as a part of the receiver apparatus 102.

Figure 2:
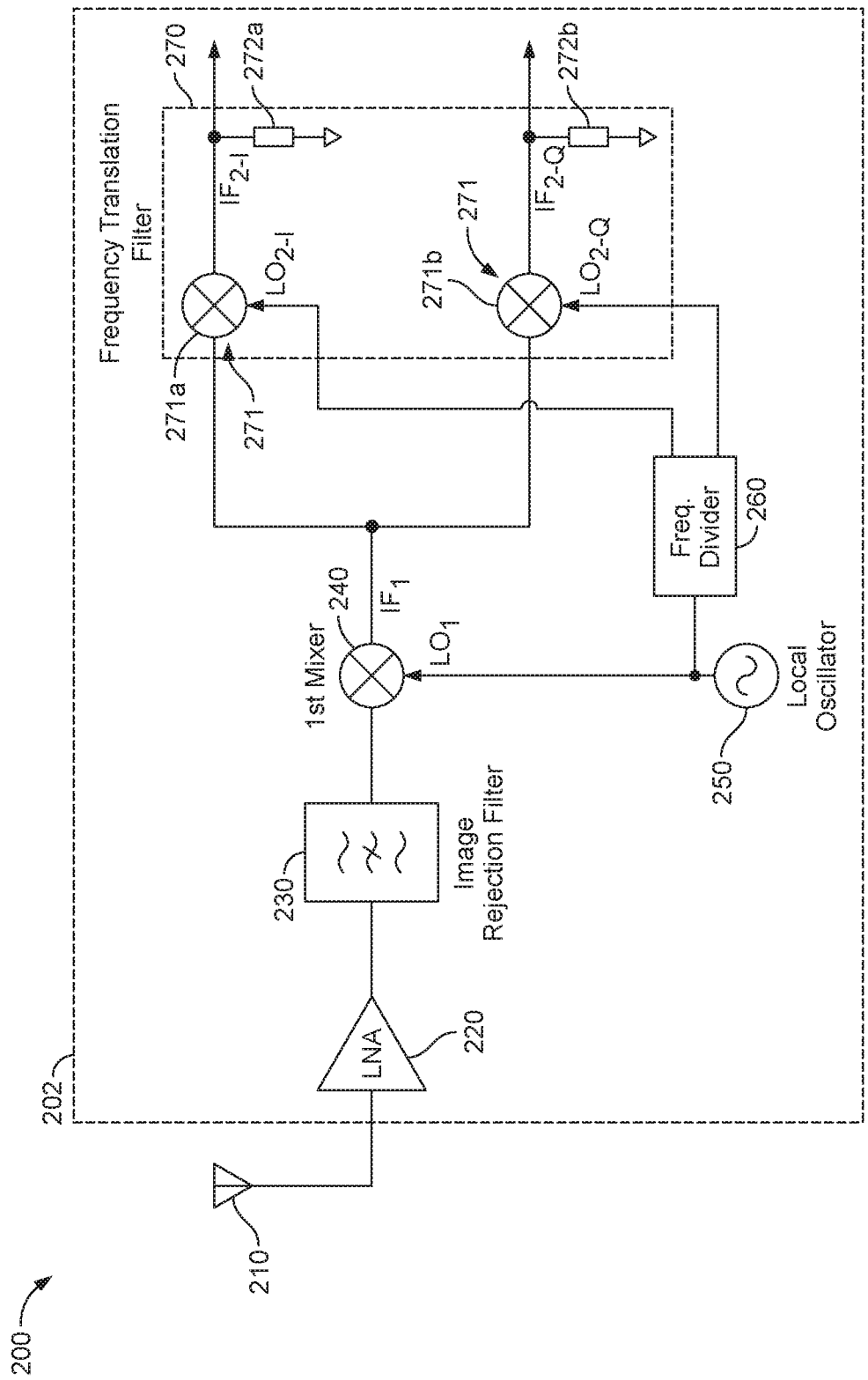
FIG. 2 is a schematic diagram illustrating another embodiment of a receiver apparatus implemented as part of a super-heterodyne radio receiver, consistent with other embodiments of the present disclosure.

FIG. 2 illustrates a second exemplary embodiment of a receiver apparatus 202 implemented within a super-heterodyne radio receiver 200 having an antenna 210 and a low-noise amplifier (LNA) 220. The receiver apparatus 202 comprises an image rejection filter 230, a first mixer 240, a local oscillator 250, a frequency divider 260, and a frequency translation filter 270.

The receiver apparatus 202 is identical to the receiver apparatus 102 illustrated in FIG. 1, with the exception of the lack of a second local oscillator that produces a third signal ($LO_3$) that feeds into the frequency divider 260. The frequency divider 260 is coupled to receive as input, the first signal ($LO_1$) at the first frequency ($f_{LO1}$) produced by the local oscillator 250 and configured to produce a plurality of second signals ($LO_2$) each at a second frequency ($f_{LO2}$). In the present embodiment, the plurality of second signals comprise an in-phase LO signal ($LO_{2-I}$) and a quadrature phase LO signal ($LO_{2-Q}$) each having the same amplitude and occurring at the second frequency ($f_{LO2}$). In one aspect of the present embodiment, the in-phase and the quadrature-phase LO signals are 90 degrees phase shifted from each other. This architecture is referred herein to as a "sliding IF" receiver. This configuration ties the intermediate frequency ($f_{IF1}$) of the intermediate signal $IF_1$ to the RF frequency ($f_{RF}$), such that the intermediate frequency $f_{IF1}$ "slides" with any changes in the RF frequency ($f_{RF}$).

A down-conversion operation for the super-heterodyne receiver is described next with reference to FIG. 2.

A down-conversion path of the RF signal starts with reception of the RF signal by the antenna 210. The received RF signal may contain various frequency components, including frequencies outside of a desired RF frequency band. The desired band contains information that is assumed to be useful and centered around a carrier frequency of the RF signal. The other frequency bands may contain noise and interference signals that would interfere with the extraction of information from the desired band. Optionally, the low-noise amplifier (LNA) 220 amplifies the received RF signal, preferably introducing as little additional noise as practical into the received RF signal. After amplification by the LNA 220, the amplified RF signal is filtered by the image rejection filter 230. The operation of the image rejection filter 230 is described in further detail below.

The filtered RF signal is then fed to the first mixer 240, where it is mixed with the first signal ($LO_1$) produced by the local oscillator 250. The first mixer 240 is configured to produce both sum and difference beat frequency signals. The first mixer 240, for example, produces the intermediate signal ($IF_1$) having the intermediate frequency ($f_{IF1}$), by mixing the first signal ($LO_1$) with the filtered RF signal. Aspects of the mixing process are well known by the skilled person.

The intermediate signal ($IF_1$) having the intermediate frequency ($f_{IF1}$) may be further down-converted by a quadrature mixer 271 of the frequency translation filter 270 to produce the second intermediate frequency signals ($IF_{2-I}$ and $IF_{2-Q}$) at a second intermediate frequency ($f_{IF2}$), hereafter termed second intermediate signals ($IF_2$). $IF_1$ is fed to each of passive mixers 271a and 271b at their respective inputs. The plurality of second signals ($LO_2$), including the in-phase LO signal ($LO_{2-I}$) and the quadrature-phase LO signal ($LO_{2-Q}$), are fed to the respective passive mixers 271a and 271b. The passive mixers 271a and 271b are configured to mix the intermediate signal ($IF_1$) with LO signals $LO_{2-I}$ and $LO_{2-Q}$, respectively, to produce the second intermediate signals $IF_{2-I}$ and $IF_{2-Q}$, respectively. Each of the second signals ($LO_2$) are at the second frequency ($f_{LO2}$), and the second intermediate signals ($IF_{2-I}$ and $IF_{2-Q}$) are at the second intermediate frequency ($f_{IF2}$). The relation between $f_{IF1}$ and $f_{IF2}$ is given by:

$$f_{IF2} = f_{IF1} - f_{LO2} \quad (1)$$

After output by the frequency translation filter 270, second intermediate signals $IF_{2-I}$ and $IF_{2-Q}$ may be summed for additional demodulation and detection to extract the useful information contained within, or may be subject to a further mixing process not illustrated herein.

In the "sliding IF" super-heterodyne receiver illustrated in FIG. 2, in one exemplary implementation, the frequency divider 260 is configured as a "divide-by-2" frequency divider, and the plurality of second signals ($LO_2$) at the second frequency ($f_{LO2}$) are directly derived from the first signal ($LO_1$) at the first frequency ($f_{LO1}$) via the "divide-by-2" frequency divider 260. The frequency divider 260 generates in-phase and quadrature phase LO signals ($LO_{2-I}$, $LO_{2-Q}$) that effect the second or final frequency down-conversion to base band. Providing the first frequency ($f_{LO1}$) at twice the value of the second frequency ($f_{LO2}$) results in the following frequency relationships for the first down-conversion.

$$f_{LO1} = 2 \cdot f_{RF}/3 \text{ and } f_{IF1} = f_{RF}/3 \quad (2a)$$

Alternatively, the frequency divider 260 may divide the first frequency ($f_{LO1}$) by a factor of four via a "divide-by-four" frequency divider 260, which results in the following frequency relationship.

$$f_{LO1} = 4 \cdot f_{RF}/5 \text{ and } f_{IF1} = f_{RF}/5 \quad (2b)$$

Since it is generally more difficult to design circuits for high frequency, as previously described, it may be desirable to design operation with a relatively lower IF frequency. On the other hand, by choosing a relatively lower IF frequency, the frequency separation between the image band and the desired band decreases, so that suppression of signals in the image band provided by the image rejection filter 130 or 230 becomes less effective as the division factor of the frequency divider 260 increases. It would be desirable to maintain the suppression of the image band at an acceptable level while operating with a relatively high division factor of the frequency divider 260 to obtain a lower IF frequency.

A person skilled in the art will now appreciate that the principle of operation for the "sliding IF" receiver would be similar to the more general example of the super-heterodyne receiver 100 illustrated in FIG. 1.

Figure 3:
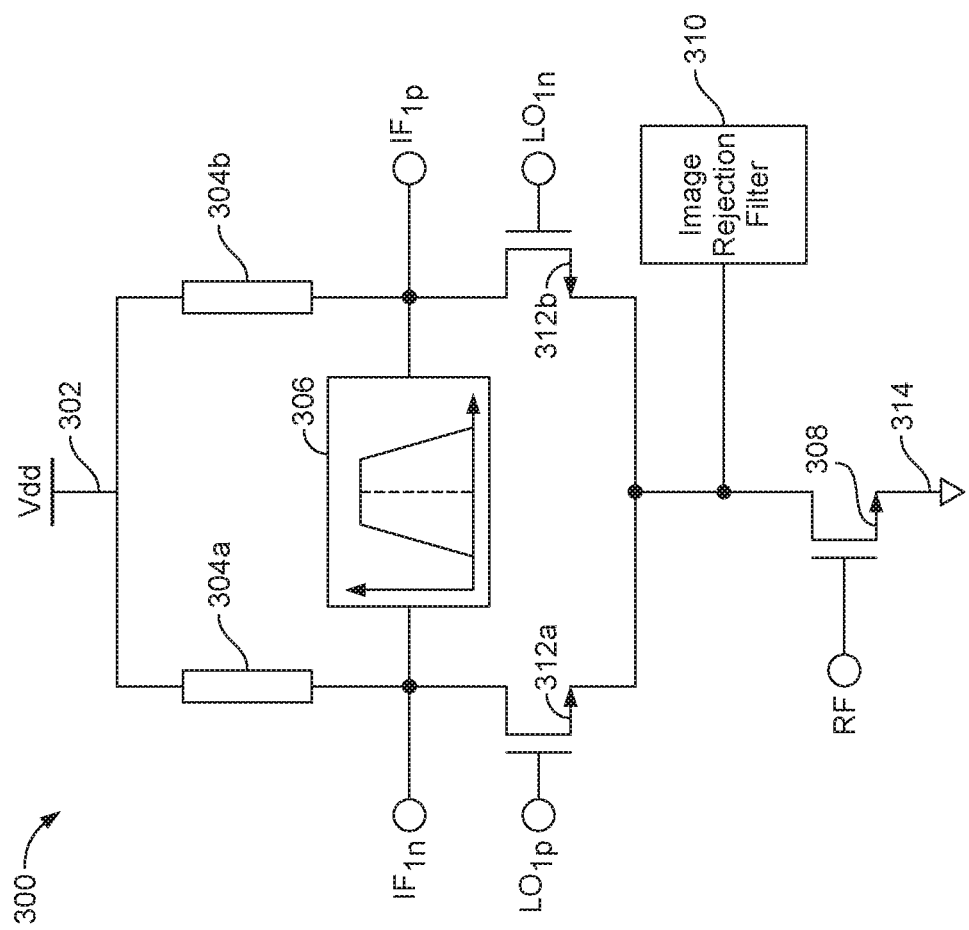
FIG. 3 is a circuit diagram illustrating part of an exemplary super-heterodyne radio receiver implemented with CMOS RF integrated circuitry, consistent with some embodiments of the present disclosure.

FIG. 3 illustrates an RF integrated CMOS circuit 300, which is an implementation of the receiver apparatus 102 or 202 illustrated in FIG. 1 and FIG. 2, respectively. For clarity, FIG. 3 omits other components such as an antenna, local oscillators, a frequency divider, and a low-noise amplifier (LNA). However, it will now be appreciated by a skilled person in the art that FIG. 3 only illustrates one possible implementation of the receiver apparatus 102 or 202, and that the receiver apparatus 102 or 202 having a frequency translation filter as disclosed herein can be implemented in other configurations and with different circuitry.

The RF integrated CMOS circuit 300 is configured for connection to a power supply voltage Vdd 302, and includes a pair of load impedances 304a and 304b, a frequency translation filter 306, a tail transistor 308, an image rejection filter 310, and a pair of transistors 312a and 312b, otherwise referred to as a differential pair. The power supply voltage Vdd 302, the load impedances 304a and 304b, the differential transistor pair 312a and 312b, and the tail transistor 308 together form a real, active, single-balanced mixer, which is a non-limiting embodiment of the first mixer 140 or 240. In FIG. 3, the power supply voltage Vdd 302 is coupled to a first terminal of the load impedances 304a and 304b, a second terminal of which are coupled to the drain terminals of the transistors 312a and 312b, respectively. The frequency translation filter 306, which corresponds to the frequency translation filter 170 or 270, is coupled between the drain terminals of the transistors 312a and 312b. A local oscillator not illustrated in FIG. 3, provides a positive first signal ($LO_{1p}$) and a negative first signal ($LO_{1n}$) at the gates of the transistors 312a and 312b, respectively. The transistors 312a and 312b output a positive intermediate signal ($IF_{1n}$) and a negative intermediate signal ($IF_{1p}$) at their respective drain terminals. The source terminals of the transistors 312a and 312b are coupled to each other, which is in turn coupled to the drain terminal of the tail transistor 308. The image rejection filter 310 is coupled to the RF integrated CMOS circuit 300 at a node connecting the drain terminal of the tail transistor 308 with the source terminals of the transistors 312a and 312b. The source terminal of the tail transistor 308 may be coupled to a reference potential or voltage, such as a ground 314. If provided as part of a super-heterodyne receiver, an antenna structure and/or a low-noise amplifier (LNA), not shown in FIG. 3, may receive and amplify the RF signal, and couple the amplified signal to the gate of the tail transistor 308.

Figure 4:
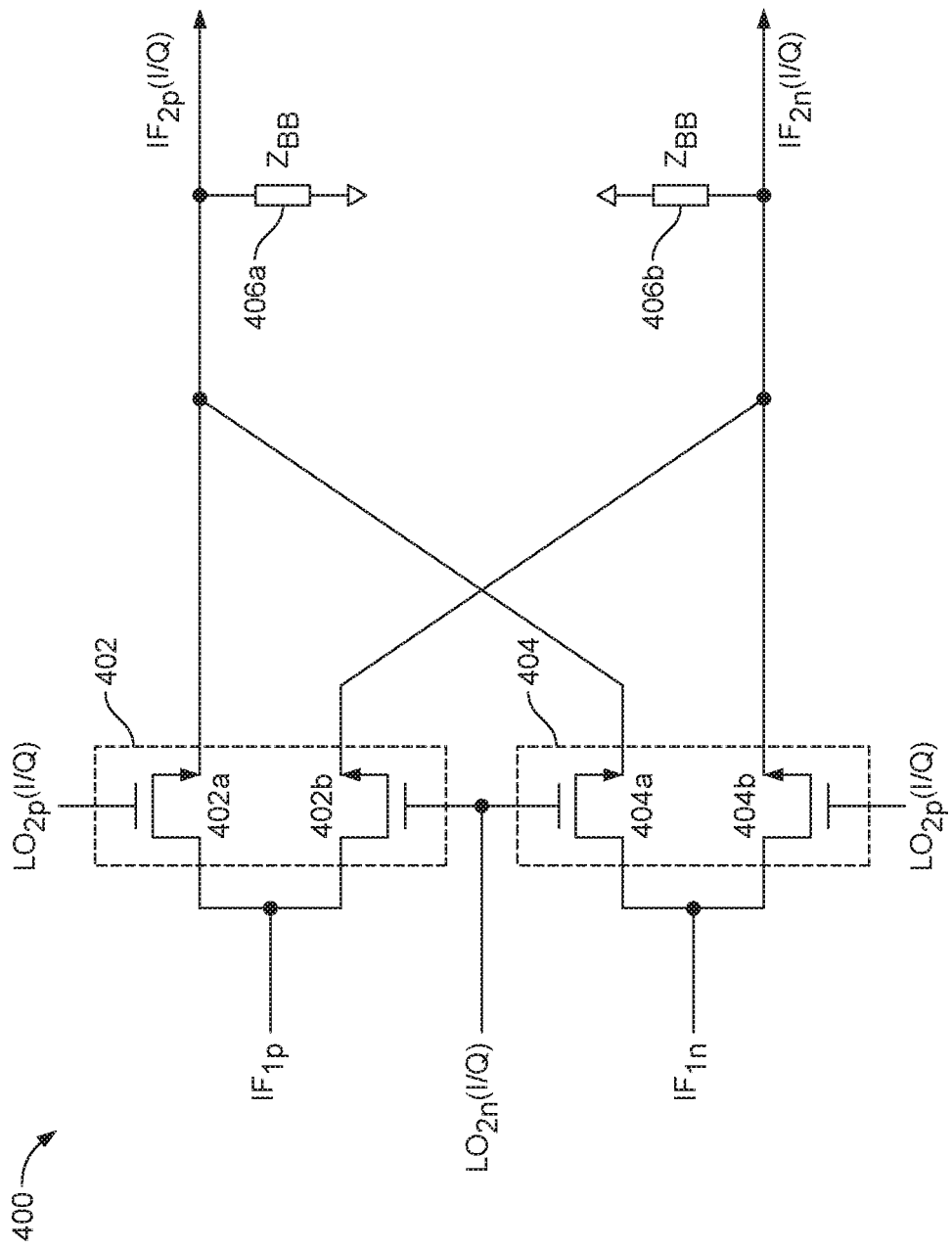
FIG. 4 is a schematic diagram illustrating an implementation of a frequency translation filter consistent with some embodiments of the present disclosure.

FIG. 4 illustrates an exemplary differential implementation of the frequency translation filter 400. For simplicity, only one-half, e.g., in-phase path, of the frequency translation filter is shown. The other side, e.g., quadrature phase path, may be implemented in the same manner. The frequency translation filter 400 includes transistor pairs 402 and 404 configured as a differential passive mixer which may correspond to one of the passive mixers 271a and 271b. The frequency translation filter 400 further includes impedances 406a and 406b, one terminal of which is coupled to the outputs of the transistor pairs 402 and 404. The other terminal of each of the impedances 406a and 406b is coupled to a reference potential or voltage, such as ground. In contrast to an "active" mixer disclosed in FIG. 3, the passive mixer in the frequency translation filter 400 does not require Vdd to provide power for the mixing process. The transistor pair 402 comprises transistors 402a and 402b, and the transistor pair 404 comprises transistors 404a and 404b. In this non-limiting example, the transistors are provided as MOSFET transistors. In some embodiments, a common terminal of transistors 402a and 402b may be coupled to the drain terminal of the transistor 312a in FIG. 3, and a common terminal of transistors 404a and 404b maybe coupled to the drain terminal of the transistor 312b in FIG. 3.

The transistors 402a and 402b are coupled to receive as input at their drain terminals, the positive intermediate signal ($IF_{1p}$). The transistors 404a and 404b are coupled to receive as input at their drain terminals, the negative intermediate signal ($IF_{1n}$). The transistors 402a and 404b are coupled to receive a positive second signal ($LO_{2p\text{-}(I/Q)}$) at their respective gates, while the transistors 402b and 404a are coupled to receive a negative second signal ($LO_{2n\text{-}(I/Q)}$) at their corresponding gates. The sources of the positive and negative second signals $LO_{2p\text{-}(I/Q)}$ and $LO_{2n\text{-}(I/Q)}$ are omitted from FIG. 4, but a skilled person will now appreciate that the positive and negative second signals $LO_{2p\text{-}(I/Q)}$ and $LO_{2n\text{-}(I/Q)}$ may be produced, for example, by the local oscillator 180, or the frequency divider 160 or 260. Moreover, the positive and negative second signals $LO_{2p}$ and $LO_{2n}$ may be either in-phase signals or quadrature signals. The transistors 402a and 404a are coupled to produce a positive second intermediate signal ($IF_{2p\text{-}(I/Q)}$) at their source terminals, and the transistors 402b and 404b are coupled to produce a negative second intermediate signal ($IF_{2n\text{-}(I/Q)}$) at their respective source terminals. Since the transistors shown in FIG. 4 essentially operate as switches, the skilled person will appreciate that the drain and source terminals of the transistors 402a and 402b and the transistors 404a and 404b can be interchanged without affecting the operation of the circuit.

A skilled person will now appreciate that although only one passive mixer is illustrated in FIG. 4, the quadrature mixer 171 or 271 comprises two such passive mixers. For example, the elements and the arrangement of elements of the passive mixers 271a and 271b are substantially similar. Moreover, a skilled person will now appreciate that the positive second intermediate signal ($IF_{2p\text{-}(I/Q)}$) and the negative second intermediate signal ($IF_{2n\text{-}(I/Q)}$) are either in-phase signals or quadrature-phase signals, depending whether the frequency translation filter 400 is coupled to receive the in-phase second signals ($LO_{2p/n\text{-}I}$) or the quadrature-phase second signals ($LO_{2p/n\text{-}Q}$). Moreover, a skilled person will also now appreciate that the passive mixer 400 may be configured such that the switch pairs 402 and 404 receive the positive intermediate signal ($IF_{1p}$) and the negative intermediate signal ($IF_{1n}$) at their respective source terminals and produce the positive second intermediate signal ($IF_{2p\text{-}(I/Q)}$) and the negative second intermediate signal ($IF_{2n\text{-}(I/Q)}$) at their respective drain terminals.

Aspects of the image rejection characteristic of receiver apparatus 102 or 202 are described below.

One aspect of a real mixer is that during the down-conversion process, the mixer may down convert frequency components of the RF signal from bands outside the desired RF band into the intermediate signal. In particular, a real frequency mixer may be susceptible to convert such signals when signals in the image band are present, where the image frequency ($f_{IM}$) is given by the relations (3) and (4):

$$f_{IF_1} = f_{LO_1} - f_{IM} \qquad (3)$$

Substituting for terms from equations (2a), for operation of the "sliding IF" receiver illustrated in FIG. 2, the expression for the image frequency ($f_{IM}$) is given as:

$$f_{IM} = f_{RF}/3 \qquad (4)$$

As noted above, the desired band includes a desired signal containing useful information modulated onto the RF signal that is to be received and processed. However, the signal in the desired band may have a low amplitude. The image band typically contains noise and may also include a blocker or interference signal at a significantly higher amplitude than the desired signal in the desired band. Any signal (i.e., noise and interference signal) that exists around the image frequency ($f_{IM}$) may be mixed by the first mixer 240 and down-converted into $IF_1$ along with the desired signal in the desired band. However, the image band and, consequently, signals appearing in the image band may be rejected prior to frequency translation at the first mixer 240. The level of image rejection is determined by the selectivity of the image rejection filter 230, with the desired signal in the desired band only experiencing minimum attenuation by the image rejection filter 230. The filtered RF signal is fed to the first mixer 240, which in turn down-converts equally any remaining signal in both the image band and the desired band, to produce the intermediate signal ($IF_1$).

Figure 5:
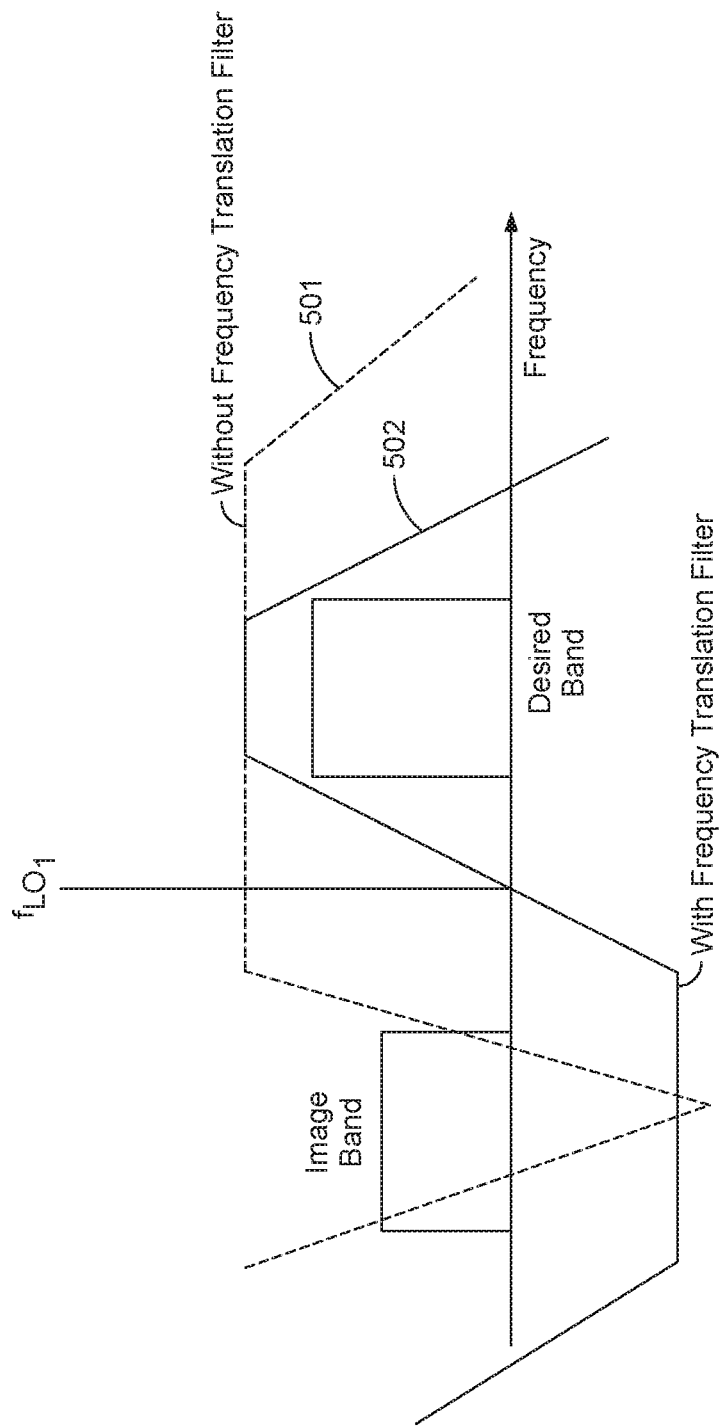
FIG. 5 is a graphical illustration showing the selectivity of a receiver apparatus, both with and without the presence of the frequency translation filter.

Preferably, the image rejection filter 230, implemented as a notch filter, rejects all of the image band. However, due to design considerations and ease of IC integration, it may not be possible to design an image rejection filter with sufficient suppression in the image band. All notch filters have a finite image response, meaning noise and interference signals existing at the frequencies near the edge of or inside the image band may not be filtered sufficiently, such that these signals may partially corrupt the intermediate signal ($IF_1$) by their presence, especially if they appear at high signal strength. Therefore, the above disclosed embodiments consistent with the present disclosure provide improvement to further increase the image rejection response. FIG. 5 illustrates the limitation of an image rejection filter with a narrow image rejection bandwidth.

FIG. 5 is a graphical representation of a frequency response of an image rejection filter such as image rejection filter 130 or 230, implemented as a notch filter, both with and without the presence of a frequency translation filter, such as the frequency translation filter 170 or 270. FIG. 5 illustrates the image band and the desired band spaced equally from the first frequency ($f_{LO1}$) at the input of the image rejection filter 230. The horizontal axis is frequency centered at the first frequency ($f_{LO1}$). The vertical axis represents relative signal power. Dashed trace 501 represents the frequency response of the image rejection filter 230 in a conventional super-heterodyne receiver, i.e., that does not include a frequency translation filter. For frequencies below the first frequency ($f_{LO1}$) (on the left of the first frequency ($f_{LO1}$)), the image rejection filter 230 has a stop-band with a finite and narrow bandwidth centered around the image frequency. For frequencies above the first frequency ($f_{LO1}$) (on the right side of first frequency ($f_{LO1}$)), the image rejection filter 230 has a wide pass-band centered around the desired band. However, the bandwidth of the stop-band may be too narrow to adequately reject the entire image band, such that noise and interference signals at the edge of the image band may be mixed by the first mixer 140 or 240 into or close to the intermediate signal ($IF_1$) band.

In view of these limitations of the image rejection filter 130 or 230, embodiments described herein improve overall image rejection by implementation of the frequency translation filter 170 or 270 in receiver apparatus 102 or 202, respectively. For example, when the frequency translation filter 170 or 270 is coupled to the output of the first mixer 140 or 240 in the receiver apparatus 102 or 202, the frequency translation filter 170 or 270 has a desirable effect on the desired and image frequency response of the receiver apparatus 102 or 202. Solid trace 502 represents a composite frequency response of the image rejection filter 130 or 230 and the frequency translation filter 170 or 270, respectively, consistent with embodiments of the present disclosure.

In FIG. 5, solid trace 502 illustrates that the addition of the frequency translation filter 170 or 270 narrows the bandwidth of the pass-band around the "desired band." Moreover, the frequency translation filter 170 or 270 also provides a wider bandwidth of the stop-band around the image band at the same time as the bandwidth of the pass-band around desired signal band is narrowed, as illustrated by the solid trace 502. The impact of noise and interference signals close to the desired RF carrier frequency ($f_{RF}$) and the impact of noise and interference signals over a wide frequency range near an image frequency ($f_{IM}$) at the center of the image band can be significantly minimized at the same time. Narrowing of the band-pass response around the desired band while widening the band-stop response around the image band also improves the receiver selectivity, allowing the receiver apparatus 102 or 202 to be more tolerant of interference that may occur across the RF spectrum.

Figure 6:
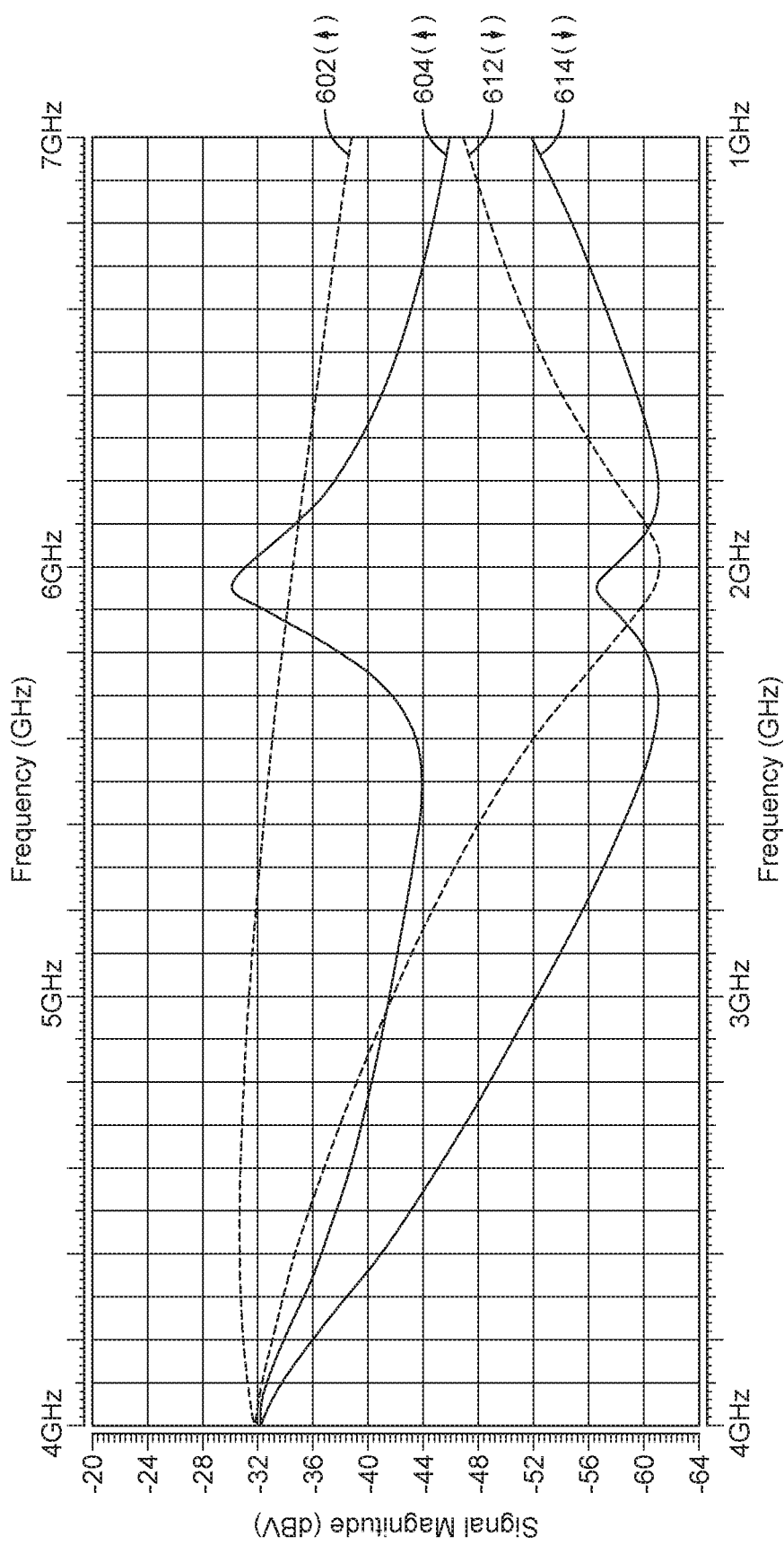
FIG. 6 is a graphical representation of simulation results illustrating effects of an image rejection filter observed at an output of a first mixer, in response to input frequencies in the image band and the desired band, both with and without the presence of the frequency translation filter, consistent with some embodiments of the present disclosure.

FIG. 6 is a graphical representation of simulation results illustrating filtering characteristics at the output of the first mixer 140 or 240, in response to input frequencies in the image band and the desired band. Dashed curves 602 and 612 illustrate the response to frequencies in the desired band and the image band, respectively, resulting from only the image rejection filter 130 or 230. Solid curves 604 and 614 illustrate the response to frequencies in the desired band and the image band according to exemplary embodiments of the present disclosure.

The simulations plotted in FIG. 6 were performed at the transistor level of the "sliding IF" receiver illustrated in FIG. 2. Simulations were performed using the simulation tool Cadence Spectre RF™. The parameters for the simulation assumed a typical notch filter designed to have a "notch" at 2 GHz and therefore reject frequencies around 2 GHz, the input RF signal was at 6 GHz, an intermediate frequency ($f_{IF1}$) was centered at 2 GHz, first frequency ($f_{LO1}$) was 4 GHz, and the corresponding image frequency ($f_{IM}$) was 2 GHz. The horizontal axis refers to an absolute frequency range that corresponds to the RF range of frequencies (4 GHz-7 GHz (above $f_{LO1}$) for curves 602 and 604 in the desired band, labeled on the top of the graph; 4 GHz-1 GHz (below $f_{LO1}$) for curves 612 and 614 in the image band, labeled on the bottom of the graph), and the vertical axis is signal level at the first mixer output expressed in decibels relative to 1 volt (dBV). A skilled person will now appreciate that the parameters given in the simulation are mere examples to illustrate effects of the disclosed embodiments, and is not the only implementation of the embodiments consistent with the present disclosure.

Curve 602 represents the frequency response around the RF center frequency ($f_{RF}$) in the desired band. As seen in curve 602, with only the image rejection filter 130 or 230, the receiver apparatus 202 has a wide bandwidth of the pass-band around the center RF frequency ($f_{RF}$) of 6 GHz. The simulation confirms that the level of signals in the desired band (shown with reference to top horizontal axis from 4 GHz to 7 GHz) varies only slightly, meaning that there is little selectivity of signals in the desired band. Curve 612 represents the frequency response of the image rejection filter around the image frequency (shown with bottom horizontal axis from 4 GHz to 1 GHz), including a stop-band with a bandwidth around the center image frequency ($f_{IM}$). Curve 612 confirms that the signal level decreases moving toward the center image frequency ($f_{IM}$) at 2 GHz, and increases moving away from the center image frequency ($f_{IM}$), as expected for a notch filter.

An image rejection ratio can be estimated based on the simulated results. The image rejection ratio is a ratio of a level of presence of the image band signals to the level of presence of the desired band signals. The image rejection ratio can be obtained by determining the difference between the value of signal level of curve 602 at 6 GHz (center of desired band) and the value of signal level of curve 612 at 2 GHz. For example, curve 602 shows that a signal in the RF band ($f_{RF}$) at 6 GHz generates a signal level of −35 dBV when it is frequency translated to the intermediate frequency ($f_{IF1}$). At the same time, curve 612 shows that a signal from the image band at 2 GHz generates a signal level of −61 dBV when it is translated to the intermediate frequency ($f_{IF1}$). In FIG. 6, the image rejection ratio is close to 25 dB at frequencies around the center image frequency ($f_{IM}$) of 2 GHz. Moreover, curve 612 shows that the receiver apparatus 102 or 202 with only image rejection filter 130 or 230 provides a 20 dB level of image rejection ratio, over a bandwidth of about 500 MHz centered around the center image frequency ($f_{IM}$)

Curve 604 represents the frequency response of a signal around the desired band at the center RF frequency ($f_{RF}$) according to embodiments of the present disclosure. As described above, the simulation confirms that with the frequency translation filter 270, the receiver 200 has a narrower bandwidth of the pass-band around the center RF frequency ($f_{RF}$). The simulation illustrates that attenuation for signals (shown with reference to top horizontal axis from 4 GHz to 7 GHz) varies significantly. At 6 GHz, a signal level of −31 dBV is generated, while at 5.6 GHz the signal level is −44 dBV. The additional selectivity at the desired band is desirable to reduce the unwanted impact of close-to-carrier blocker or interferer signals. Curve 614 represents the composite frequency response of the image rejection filter and the frequency translation filter around the image band (shown with reference bottom horizontal axis 4 GHz to 1 GHz), including a bandwidth of a stop-band around the center image frequency ($f_{IM}$). The image rejection ratio is close to 25 dB at the center image frequency ($f_{IM}$) at 2 GHz, which is similar to the case without frequency translation filter 270, despite an apparent "bump" in attenuation of curve 614 at the center image frequency ($f_{IM}$). More importantly, however, curve 614 shows greater image rejection in frequencies farther from the center image frequency ($f_{IM}$) as compared to curve 612. For example, curve 614 has greater than 20 dB image rejection ratio over a bandwidth of 2 GHz, from 1 GHz to 3 GHz. The "bump" represents less attenuation for the signal at the image frequency ($f_{IM}$), which is undesirable. However, this effect is partially compensated because the signal at the center RF frequency ($f_{RF}$) is at a higher amplitude, therefore the image rejection ratio at the band center remains comparable to that of a conventional super-heterodyne receiver despite this effect.

Figure 7:
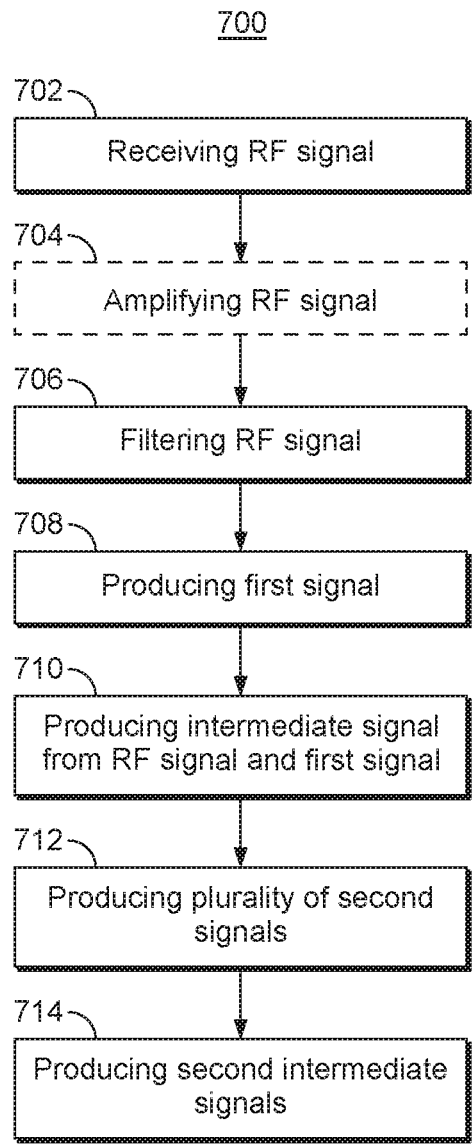
FIG. 7 is a flow chart illustrating an exemplary process for receiving and processing an RF signal, consistent with the disclosed embodiments.

FIG. 7 is a flow chart illustrating an exemplary embodiment of a process 700 of down-converting an RF signal, using the receiver apparatus 102 or 202.

Process 700 begins with receiving an RF signal in step 702. The receiver apparatus 102 or 202 may receive the RF signal from external sources coupled to the receiver apparatus 102 or 202. In some alternative embodiments, the RF signal may be received by the antenna 110 or 210, and amplified by the low-noise amplifier (LNA) 120 or 220 in an optional step 704. In step 706, the received RF signal is filtered by the image rejection filter 130 or 230, and is then coupled to the first mixer 140 or 240. In step 708, the first local oscillator 150 or 250 produces the first signal ($LO_1$) which is fed to the first mixer 140 or 240. In step 710, the first mixer 140 or 240 performs a first stage mixing operation, producing the intermediate signal ($IF_1$) at the intermediate frequency ($f_{IF1}$) from the operation of mixing the first signal ($LO_1$) with the filtered RF signal. In step 712, the frequency divider 160 or 260 produces a plurality of second signals ($LO_2$). In the exemplary embodiments, the plurality of second signals comprise the in-phase LO signal ($LO_{2-I}$) and the quadrature phase LO signal ($LO_{2-Q}$), each coupled to the quadrature mixer 171 or 271. In the exemplary embodiment, the passive mixer 171a or 271a is coupled to receive $LO_{2-I}$, and the passive mixer 171b or 271b is coupled to receive $LO_{2-Q}$. The frequency divider 160 or 260 may be coupled to receive the first signal ($LO_1$) as an input, or alternatively, receive $LO_3$ as an input, $LO_3$ being produced by the second local oscillator 180. In step 714, the frequency translation filter 170 or 270 produces the second intermediate signals ($IF_2$) at the second intermediate frequency ($f_{IF2}$). In the exemplary embodiment, the passive mixer 171a or 271a produces the in-phase component of the second intermediate signal ($IF_{2-I}$), and the passive mixer 171b or 271b produces the quadrature phase component of the second intermediate signal ($IF_{2-Q}$).

It will be appreciated by a skilled person that FIGS. 1, 2 and 4 only illustrate one possible implementation of the impedances connected to the outputs of quadrature mixers 171 and 271. For example, the impedances, which may be 172a, 172b, 272a or 272b, may each include one or more resistive elements that are connected to one or more capacitive elements or capacitors. In another example, one or more inductive elements may be connected to one or more capacitive elements or capacitors so that the impedances are each an LC circuit. Alternatively, one or more inductive elements and resistive elements may be connected to one or more capacitors to form the impedances so that the impedances are each an RLC circuit.

It will be appreciated that although FIG. 1 and FIG. 2 illustrate circuits as single ended circuits, the embodiments may be implemented in differential circuits without departing from the teachings of the present disclosure.

It will be appreciated by a skilled person that the super-heterodyne receivers 100 and 200 may be implemented in integrated circuit (CMOS, SiGe, GaAs) radio receivers for all wireless applications, including cellular (e.g. LTE), connectivity (e.g. WLAN) and GNSS (e.g. GPS).

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

Other embodiments will be apparent from a consideration of the specification and practice of the embodiments disclosed herein. It is intended that the specification and examples be considered as an example only, with a true scope and spirit of the disclosed embodiments being indicated by the following claims.

Descriptions of the disclosed embodiments are not exhaustive and are not limited to the precise forms or embodiments disclosed. Modifications and adaptations of the embodiments will be apparent from consideration of the specification and practice of the disclosed embodiments. For example, the described implementations include hardware, firmware, and software, but systems and techniques consistent with the present disclosure may be implemented as hardware alone. Additionally, the disclosed embodiments are not limited to the examples discussed herein.

In this description, the conjunction "and/or" may mean each of the listed items individual, a combination of the listed items, or both. Moreover, the "and/or" conjunction as used in this specification may include all combinations, sub-combinations, and permutations of listed items. For example, the phrase "A, B, and/or C" may mean each of A, B, and C individually, as well as A, B, and C together in addition to sub-groups A and B, A and C, and B and C. Unless specified otherwise, this example use of "and/or" may also intend to include all potential orders of items in each group and sub-group, such as B-C-A, B-A-C, C-A-B, C-B-A, and A-C-B, along with the subgroups C-B, B-A, and C-A.

Moreover, while illustrative embodiments have been described herein, the scope includes any and all embodiments having equivalent elements, modifications, omissions, combinations (e.g., aspects across various embodiments), adaptations, or alterations based on the present disclosure. The elements in the claims are to be interpreted broadly based on the language employed in the claims and not limited to examples described in the present specification or during the prosecution of the application, of which examples are to be construed as non-exclusive. Further, the steps of the disclosed methods may be modified in any manner, including by reordering steps or inserting or deleting steps. It is intended, therefore, that the specification and examples be considered as exemplary only, with the true scope and spirit being indicated by the following claims and their full scope of equivalents.

What is claimed is:

1. A receiver apparatus coupled to receive a radio frequency (RF) signal, the RF signal including frequency components in a desired band and an image band, comprising:
    an image rejection filter;
    a local oscillator configured to produce a first signal at a first frequency;
    a frequency divider configured to produce a plurality of second signals each at a second frequency;
    a first mixer, coupled to receive the RF signal at a first input and the first signal at a second input, and configured to produce an intermediate signal at an intermediate frequency, the intermediate frequency being dependent on the first frequency; and
    a frequency translation filter comprising a plurality of passive mixers each coupled to receive the intermediate signal at a first input and a different one of the plurality of second signals at a second input; and
        at least one impedance coupled as a load to an output of each of the plurality of passive mixers, wherein:
    the image rejection filter and the frequency translation filter are configured to operate in conjunction to form a band-pass filter in the desired band and a band-stop filter in the image band and to apply the band-pass filter and band-stop filter to the RF signal.

2. The receiver apparatus of claim 1, wherein the at least one impedance comprises a capacitor.

3. The receiver apparatus of claim 1, wherein the image rejection filter is a notch filter.

4. The receiver apparatus of claim 1, wherein a frequency response of the image rejection filter has a stop-band comprising a first bandwidth.

5. The receiver apparatus of claim 4, wherein a composite frequency response of the image rejection filter and the frequency translation filter has a stop-band comprising a second bandwidth, the second bandwidth being greater than the first bandwidth.

6. The receiver apparatus of claim 1, wherein the receiver apparatus is configured to form part of a super-heterodyne receiver, the super-heterodyne receiver further comprises:
    an antenna configured to receive the RF signal; and
    a low-noise amplifier coupled to receive the RF signal from the antenna and configured to amplify the RF signal, wherein the first mixer is coupled to receive the RF signal after amplification.

7. The receiver apparatus of claim 1, wherein the first mixer and the frequency translation filter are implemented in complementary metal-oxide semiconductor (CMOS) technology.

8. The receiver apparatus of claim 1, wherein the plurality of second signals comprise an in-phase signal and a quadrature-phase signal; and
    at least one of the passive mixers is coupled to receive the in-phase signal, and at least another one of the passive mixers is coupled to receive the quadrature-phase signal.

9. The receiver apparatus of claim 1, wherein the second frequency is lower than the first frequency.

10. The receiver apparatus of claim 1, wherein the local oscillator is a first local oscillator, the receiver apparatus further comprises:
    a second local oscillator configured to produce a third signal at a third frequency, the frequency divider being coupled to receive the third signal.

11. The receiver apparatus of claim 1, wherein the frequency divider is coupled to receive the first signal.

12. The receiver apparatus of claim 1, wherein the image rejection filter is integrated into the first mixer.

13. A method of down-converting a radio frequency (RF) signal in a receiver apparatus, the method comprising:
    filtering the RF signal by an image rejection filter to reject frequency components in an image band;
    producing a first signal at a first frequency by a local oscillator;
    coupling the filtered RF signal and the first signal to a first mixer to produce an intermediate signal at an intermediate frequency;
    producing a plurality of second signals by a frequency divider, each at a second frequency; and
    coupling the intermediate signal and the plurality of second signals to a frequency translation filter having a cut-off frequency, the frequency translation filter comprising a plurality of passive mixers each coupled to receive the intermediate signal at a first input and a different one of the plurality of second signals at a second input; and
        at least one impedance coupled as a load to an output of each of the plurality of passive mixers, wherein:
    the image rejection filter and the frequency translation filter are configured to operate in conjunction to form a band-pass filter in a desired band and a band-stop filter in the image band and to apply the band-pass filter and band-stop filter to the RF signal.

14. The method of claim 13, wherein the plurality of second signals comprise an in-phase signal and a quadrature-phase signal; and
    at least one of the passive mixers is coupled to receive the in-phase signal, and at least another one of the passive mixers is coupled to receive the quadrature-phase signal.

15. The method of claim 13, wherein a frequency response of the image rejection filter has a stop-band comprising a first bandwidth.

16. The method of claim 15, wherein a composite frequency response of the image rejection filter and the frequency translation filter has a stop-band comprising a second bandwidth, the second bandwidth being greater than the first bandwidth.

17. The method of claim 13, wherein the second frequency is lower than the first frequency.

18. The method of claim 13, wherein the at least one impedance comprises a capacitor.

19. The method of claim 13, wherein the image rejection filter is a notch filter.

20. The method of claim 13, further comprising:
receiving the RF signal by an antenna, the received RF signal including frequency components in the image band and the desired band; and
amplifying the received RF signal by a low-noise amplifier.

* * * * *